United States Patent [19]
Nagai et al.

[11] Patent Number: 5,786,234
[45] Date of Patent: Jul. 28, 1998

[54] METHOD OF FABRICATING SEMICONDUCTOR LASER

[75] Inventors: Yutaka Nagai; Hitoshi Tada, both of Tokyo, Japan

[73] Assignee: Mitsubishi Denki Kabushiki Kaisha, Tokyo, Japan

[21] Appl. No.: 873,459

[22] Filed: Jun. 12, 1997

Related U.S. Application Data

[62] Division of Ser. No. 629,942, Apr. 12, 1996, abandoned.

[30] Foreign Application Priority Data

Oct. 17, 1995 [JP] Japan .......................... 7-268689

[51] Int. Cl.$^6$ .......................................... H01L 21/00
[52] U.S. Cl. ..................... 438/47; 438/40; 438/41; 438/745; 438/955
[58] Field of Search ........................... 372/46, 45, 43; 438/40, 41, 47, 745, 955, 289, 293

[56] References Cited

U.S. PATENT DOCUMENTS

| | | | |
|---|---|---|---|
| 4,856,013 | 8/1989 | Iwano et al. | 372/46 |
| 4,994,143 | 2/1991 | Kim | 156/649 |
| 5,175,740 | 12/1992 | Elman et al. | 372/45 |
| 5,227,015 | 7/1993 | Fujihara et al. | 156/647 |
| 5,272,109 | 12/1993 | Motoda | 372/46 |
| 5,292,685 | 3/1994 | Inoguchi et al. | 372/96 |
| 5,297,158 | 3/1994 | Naitou et al. | 372/46 |
| 5,316,967 | 5/1994 | Kaneno et al. | 437/105 |
| 5,357,535 | 10/1994 | Shima et al. | 372/45 |
| 5,395,792 | 3/1995 | Ikawa et al. | 437/129 |
| 5,469,457 | 11/1995 | Nagai et al. | 372/45 |

FOREIGN PATENT DOCUMENTS

| | | | |
|---|---|---|---|
| 0385388 | 9/1990 | European Pat. Off. | 372/45 |
| 0449553 | 10/1991 | European Pat. Off. | 372/46 |
| 0622879 | 11/1994 | European Pat. Off. | 372/46 |
| 0666625 | 8/1995 | European Pat. Off. | 372/48 |
| 57-043428 | 3/1982 | Japan | 438/289 |
| 60-021586 | 2/1985 | Japan | 438/289 |
| 62-004384 | 1/1987 | Japan | 438/289 |
| 62-035626 | 2/1987 | Japan | 438/289 |
| 62-54987 | 3/1987 | Japan | 372/46 |
| 3156989 | 7/1991 | Japan | 372/46 |
| 677588 | 3/1994 | Japan | 372/46 |

OTHER PUBLICATIONS

Nagai et al., "Large-Area Wafer Processing for 0.78-μm AlGaAs Laser Diodes", IEEE Photonics Technology Letters, vol. 7, No. 10, Oct. 1995, pp. 1101–1103.

Shima et al., "0.78-and 0.98-μm Ridge-Waveguide Lasers Buried with AlGaAs Confinement Layer Selectively Grown by Chloride-Assisted MOCVD", IEEE Journal of Selected Topics in Quantum Electronics, vol. 1, No. 2, Jun. 1995, pp. 102–109.

*Primary Examiner*—John Niebling
*Assistant Examiner*—Long Pham
*Attorney, Agent, or Firm*—Leydig, Voit & Mayer, Ltd.

[57] ABSTRACT

A method of fabricating a semiconductor laser includes successively epitaxially growing on a first conductivity type semiconductor substrate, a first conductivity type lower cladding layer, an active layer, a second conductivity type first upper cladding layer having a relatively high etching rate in an etchant, a second conductivity type etch stopping layer having a relatively low etching rate in the etchant, a second conductivity type second upper cladding layer, and a second conductivity type first contact layer; forming a stripe-shaped mask on the first contact layer; removing portions of the first contact layer and the second upper cladding layer in a first wet etching step to expose the etch stopping layer; removing portions of the second upper cladding layer in a second wet etching step to form a stripe-shaped ridge structure having a reverse mesa cross section without an intermediate construction; growing a first conductivity type current blocking layer contacting both sides of the ridge structure; and after removal of the mask, growing a second conductivity type second contact layer on the current blocking layer and on the first contact layer. The angle between the side wall of the ridge and the etch stopping layer is an acute angle so the stripe-shaped ridge structure has a perfect reverse mesa cross section and is narrowest proximate the active layer.

5 Claims, 5 Drawing Sheets

5,786,234

1

METHOD OF FABRICATING SEMICONDUCTOR LASER

This disclosure is a division of patent application Ser. No. 08/629,942, filed Apr. 12, 1996, now abandoned.

FIELD OF THE INVENTION

The present invention relates to a semiconductor laser including a ridge structure and a method of fabricating the semiconductor laser.

BACKGROUND OF THE INVENTION

FIG. 3 is a perspective view illustrating a prior art semiconductor laser. In the figure, reference numeral 1 designates an n type GaAs semiconductor substrate having a (100) surface orientation. An n type $Al_xGa_{1-x}As$ (x=0.5) lower cladding layer 2 having a thickness of 1.5~2 μm is disposed on the (100) surface of the substrate 1. An active layer 3 having an effective band gap energy smaller than that of the lower cladding layer 2 is disposed on the lower cladding layer 2. The active layer 3 has a quantum well structure in which three 10 nm thick $Al_vGa_{1-v}As$ (v=0.05~0.15) well layers and two 10 nm thick $Al_wGa_{1-w}As$ (w =0.2~0.35) barrier layers are alternatingly laminated and this laminated structure is put between two 35 nm thick optical guide layers comprising a material having the same composition as the barrier layer. These well layers, barrier layers, and optical guide layers are not shown in the figure. A p type $Al_xGa_{1-x}As$ (x=0.5) first upper cladding layer 4 having a thickness of 0.2~0.5 μm is disposed on the active layer 3. A p type $Al_yGa_{1-y}As$ (y =0.7) etch stopping layer 5 having a thickness of about 200 Å is disposed on the first upper cladding layer 4. A p type $Al_xGa_{1-x}As$ (x=0.5) second upper cladding layer 6 having a thickness of 1.0~2.0 μm is disposed on a center part of the etch stopping layer 5. A p type GaAs first contact layer 7 having a thickness of 0.5~1 μm is disposed on the second upper cladding layer 6. The second upper cladding layer 6 and the first contact layer 7 form a stripe-shaped ridge structure 9 extending in the longitudinal direction of the resonator of the semiconductor laser (hereinafter referred to as resonator length direction), the cross section of the ridge structure 9 in a plane perpendicular to the resonator length direction is a reverse mesa. An n type current blocking layer 12 comprising a material having an effective band gap energy smaller than that of the active layer is disposed on the etch stopping layer 5, contacting both sides of the ridge structure 9. For example, the current blocking layer 12 comprises n type GaAs. A p type GaAs second contact layer 13 having a thickness of 2~3 μm is disposed on the first contact layer 7 and on the current blocking layer 12. A p side electrode 14 is disposed on the second contact layer 13 and an n side electrode 15 is disposed on the rear surface of the substrate 1. Reference numeral 9c designates a constricted part of the ridge structure 9.

A description is given of the operation. When a forward bias voltage is applied across the p side electrode 14 and the n side electrode 15, holes are injected into the quantum well active layer 3 through the p type GaAs second contact layer 13, the p type GaAs first contact layer 7, the p type second upper cladding layer 6, and the p type first upper cladding layer 4, and electrons are injected into the quantum well active layer 3 through the n type GaAs substrate 1 and the n type lower cladding layer 2. In the active layer 3, the electrons and the holes recombine to generate induced light emission. When the quantity of the injected carriers is

2 sufficient to produce light exceeding loss in the waveguide, laser oscillation occurs.

Next, the stripe-shaped ridge structure 9 will be described in more detail. In regions adjacent to the ridge structure 9 and covered with the n type GaAs current blocking layer 12, pn junctions are produced between the n type current blocking layer 12 and the p type first upper cladding layer 4 and between the n type current blocking layer 12 and the p type second contact layer 13. Therefore, even when a forward bias voltage is applied across the p side electrode and the n side electrode, since pn junctions are produced in the regions other than the ridge structure 9 and the voltage is applied in the reverse bias direction in these regions, no current flows in these regions. That is, the n type GaAs current blocking layer 12 blocks current literally. Consequently, current flows only in the ridge structure 9 and is concentrated in the quantum well active layer 3 beneath the ridge structure 9, reaching a sufficient current density for laser oscillation. In addition, the n type GaAs current blocking layer 12 absorbs laser light produced in the quantum well active layer 3 because the band gap energy of GaAs is smaller than the effective band gap energy of the active layer 3. Thereby, the laser light is subjected to strong absorption at both sides of the ridge structure 9, so that the laser light is concentrated only in the vicinity of the ridge structure 9. As a result, oscillation occurs in the horizontal transverse mode, which is an important operating characteristic of the semiconductor laser, having a single peak and high stability.

A description is given of the process of fabricating the semiconductor laser. FIGS. 4(a)–4(e) are cross-sectional views illustrating process steps in a method of fabricating the semiconductor laser shown in FIG. 3. In the figures, the same reference numerals as those in FIG. 3 designate the same or corresponding parts. Reference numeral 8 designates a mask for forming the ridge structure 9.

FIG. 5 is an enlarged perspective view of a part A of the structure shown in FIG. 4(c). In the figure, the same reference numerals as those shown in FIG. 4(c) designate the same or corresponding parts. Reference numeral 5a designates a (100) surface of the etch stopping layer 5 that is exposed by etching. Reference numeral 9a designates an upper part of a side surface of the ridge structure 9 in the resonator length direction (hereinafter referred to as ridge side surface). The upper part 9a of the ridge side surface is a (1̄1̄1)A plane. Reference numeral 9b designates a lower part of the ridge side surface, and it is in a plane between the (1̄1̄1)A plane and the (100) plane.

Initially, an n type GaAs semiconductor wafer 1 having a (100) surface orientation is prepared. On the (100) surface of the semiconductor wafer 1, the n type lower cladding layer 2, the active layer 3, the p type first upper cladding layer 4, the p type etch stopping layer 5, the p type second upper cladding layer 6, and the p type first contact layer 7 are epitaxially grown in this order. Preferably, these layers are grown by MOCVD (Metal Organic Chemical Vapor Deposition). FIG. 4(a) shows a cross-sectional view of the wafer after the epitaxial growth.

In the step of FIG. 4(b), an insulating film, such as $Si_3N_4$ or $SiO_2$, is deposited over the p type first contact layer 7 and patterned to form a stripe-shaped mask 8 extending in a direction that provides a stripe-shaped ridge structure having a reverse mesa cross section in the first contact layer 7 and the second upper cladding layer 6 (hereinafter referred to as a reverse mesa direction), for example, the [011] direction. The width of the mask 8 in the direction perpendicular to the resonator length direction (hereinafter referred to as resonator width direction) is about 8 μm.

In the step of FIG. 4(c), using the mask 8, the first contact layer 7 and the second upper cladding layer 6 are etched until the etching front reaches the etch stopping layer 5, producing a stripe-shaped ridge structure 9 having a reverse mesa cross section (hereinafter referred to as a reverse mesa ridge structure). In this etching process, a selective etchant that etches the p type GaAs first contact layer 7 and the p type $Al_xGa_{1-x}As$ (x=0.5) second upper cladding layer 6 but does not etch the p type $Al_yGa_{1-y}As$ (y=0.7) etch stopping layer 5 is employed, whereby the ridge structure 9 is produced with high reproducibility. For example, a mixture of tartaric acid and hydrogen peroxide that is generally used as an etchant for forming a ridge, is employed. Whether the etching front reaches the etch stopping layer 5 is detected by visually observing the change of reflected light at the surface of the wafer that corresponds to the change of the layer at the surface. More specifically, when the etching front reaches the etch stopping layer 5, the interference color of the reflected light disappears. So, the wafer is taken out of the etchant the moment the interference color disappears, followed by washing of the wafer with water.

The reverse mesa ridge structure shown in FIG. 5 is fabricated in the above-described process steps. However, the ridge structure 9 does not have a perfect mesa shape in which the width in the resonator width direction (hereinafter referred to as ridge width) is tapered toward the etch stopping layer 5. As shown in FIG. 5, the ridge structure 9 has a constricted part 9c parallel to the stripe direction of the ridge at the lower part, in the vicinity of the etch stopping layer 5. In other words, the opposed side walls of the ridge structure 9 protrude toward the center of the ridge structure. In this ridge structure 9, the ridge width is tapered from the top of the ridge to the constricted part 9c and then it is increased from the constricted part 9c to the bottom of the ridge contacting the etch stopping layer 5. The side surface 9b of the lower part of the ridge makes an obtuse angle with the surface of the etch stopping layer 5 that is exposed by the above-described etching process.

The reason why the ridge structure 9 shown in FIG. 5 is formed will be described. Since the etching rate for making the (100) plane, i.e., the etching rate in the direction perpendicular to the (100) plane, is high, when the etching front reaches the etch stopping layer 5, the etching for making the ($\overline{1}11$) plane, which provides a side surface of a perfect reverse mesa ridge structure, is insufficient. As a result, a transient plane between the (100) plane and a plane producing the side surface of the reverse mesa ridge structure 9, for example, a plane between the (100) plane and the ($\overline{1}11$) plane, is produced at the lower part 9b of the side surface of the ridge structure 9.

After formation of the ridge structure 9, as shown in FIG. 4(d), the n type GaAs current blocking layer 12 is grown on the etch stopping layer 5 to bury the ridge structure 9. Since the mask 8 serves as a mask for the crystal growth, no crystal growth occurs on the ridge structure 9.

After removal of the mask 8 by wet or dry etching, the p type GaAs second contact layer 13 is grown as shown in FIG. 4(e). Finally, the n side electrode 15 and the p side electrode 14 are produced on the rear surface of the semiconductor substrate 1 and on the p type GaAs second contact layer 13, respectively, and the wafer is cleaved perpendicular to the stripe direction of the ridge structure 9 to produce resonator facets (not shown), completing the semiconductor laser shown in FIG. 3.

As described above, the reverse mesa ridge structure 9 of the prior art semiconductor laser is formed by selectively etching the p type second upper cladding layer 6 using the stripe-shaped mask 8 until the etch stopping layer 5 is exposed. In the semiconductor laser with the reverse mesa ridge structure 9, the ridge width at the bottom of the ridge structure 9 and proximate to the active layer 3 (hereinafter referred to as ridge bottom width), i.e., the ridge width at the boundary between the ridge structure 9 and the etch stopping layer 5, is very important for transverse mode control. When the ridge bottom width is wide, a higher mode of oscillation easily occurs, resulting in laser light having multiple peaks. Therefore, the ridge bottom width must be controlled precisely to be narrower than 4 μm.

However, in the semiconductor laser fabricated according to the prior art method shown in FIGS. 4(a)–4(e), the ridge structure 9 does not have a perfect reverse mesa shape. As described above, the ridge structure has the constricted part 9c parallel to the stripe direction of the ridge at the lower part in the vicinity of the etch stopping layer 5, and the ridge width is increased from the constricted part 9c toward the etch stopping layer 5. Therefore, the width of the constricted part 9c is narrowest in the ridge structure 9, that is, the narrowest ridge width is not at the bottom of the ridge structure 9. Therefore, when the ridge bottom width is reduced to less than 4 μm, the ridge width of the constricted part 9c is also reduced, and the resistance at that part is significantly increased, resulting in a degradation of the device characteristics. Especially in the high-power output operation of the laser, the heat generation at the constricted part 9c is significantly increased, whereby the laser is thermally saturated before a desired light output is produced.

SUMMARY OF THE INVENTION

It is an object of the present invention to provide a semiconductor laser including a stripe-shaped ridge structure having a reverse mesa cross section in which the width in the direction perpendicular to the resonator length direction is narrowest at the bottom of the ridge that is proximate to the active layer.

It is another object of the present invention to provide a method of fabricating the semiconductor laser.

Other objects and advantages of the invention will become apparent from the detailed description and specific embodiments described are provided only for illustration since various additions and modifications within the spirit and scope of the invention will be apparent to those of skill in the art from the detailed description.

According to a first aspect of the present invention, a method of fabricating a semiconductor laser comprises successively epitaxially growing on a surface of a first conductivity type semiconductor substrate, a first conductivity type lower cladding layer comprising a semiconductor material having an effective band gap energy, an active layer comprising a semiconductor material having an effective band gap energy smaller than the effective band gap energy of the lower cladding layer, a second conductivity type first upper cladding layer comprising the same material as the material of the first conductivity type lower cladding layer and having a relatively high etching rate by an etchant, a second conductivity type etch stopping layer comprising a semiconductor material having a relatively low etching rate by the etchant, a second conductivity type second upper cladding layer comprising the same material as the material of the second conductivity type first upper cladding layer, and a second conductivity type first contact layer comprising a semiconductor material; forming a stripe-shaped mask on the second conductivity type first contact layer, the mask extending in a reverse mesa direction that provides a stripe-shaped ridge structure having a reverse mesa cross section; using the stripe-shaped mask, removing portions of the first contact layer and the second upper cladding layer by a first wet etching to expose the etch stopping layer; removing portions of the second upper cladding layer by a second wet etching to form a stripe-shaped ridge structure having a reverse mesa cross section; growing a first conductivity type current blocking layer contacting both sides of the ridge structure; and after removal of the mask, growing a second conductivity type second contact layer comprising the same material as the material of the first contact layer on the current blocking layer and on the first contact layer. In this method, a lower portion of the ridge structure having the ridge width increasing toward the active layer is etched selectively with respect to the etch stopping layer by the second wet etching, whereby the angle produced between the side wall of the ridge and the surface of the etch stopping layer exposed by the first and second etching is made an acute angle. As a result, a stripe-shaped ridge structure having a perfect reverse mesa cross section in which the ridge width is narrowest at the bottom of the ridge proximate to the active layer is obtained.

According to a second aspect of the present invention, in the above-described method, the first conductivity type semiconductor substrate comprises GaAs, the first conductivity type lower cladding layer comprises $Al_xGa_{1-x}As$ ($0<x<1$), the second conductivity type first and second upper cladding layers comprise $Al_xGa_{1-x}As$ ($0<x<1$), the second conductivity type etch stopping layer comprises $Al_yGa_{1-y}As$ ($x<y<1$), the second conductivity type first and second contact layers comprise GaAs, and the second wet etching employs a mixture of tartaric acid and hydrogen peroxide.

According to a third aspect of the present invention, in the above-described method, the first wet etching employs the same etchant as that used for the second wet etching. Therefore, the switching from the first etching to the second etching is dispensed with, whereby the fabricating process is simplified.

According to a fourth aspect of the present invention, a semiconductor laser comprises a first conductivity type semiconductor substrate having opposed front and rear surfaces; a first conductivity type lower cladding layer disposed on the front surface of the substrate and comprising a semiconductor material having an effective band gap energy; an active layer disposed on the lower cladding layer and comprising a semiconductor material having an effective band gap energy smaller than the effective band gap energy of the lower cladding layer; a second conductivity type first upper cladding layer disposed on the active layer, comprising the same material as the material of the first conductivity type lower cladding layer and having a relatively high etching rate by an etchant; a second conductivity type etch stopping layer disposed on the first upper cladding layer and comprising a semiconductor material having a relatively low etching rate by the etchant; a stripe-shaped ridge structure comprising a second conductivity type second upper cladding layer that is disposed on the etch stopping layer and comprises the same material as the material of the second conductivity type first upper cladding layer and a second conductivity type first contact layer disposed on the second upper cladding layer and comprising a semiconductor material, the ridge structure having a reverse mesa shape with no constricted part; a first conductivity type current blocking layer contacting both sides of the ridge structure; a second conductivity type second contact layer disposed on the current blocking layer and on the first contact layer and comprising the same material as the material of the first contact layer; and first and second electrodes disposed on the rear surface of the substrate and the second contact layer, respectively. Therefore, a stripe-shaped ridge structure having a perfect reverse mesa cross section in which the ridge width is narrowest at the bottom of the ridge proximate to the active layer is obtained.

DETAILED DESCRIPTION OF THE PREFERRED EMBODIMENTS

Figure 1:
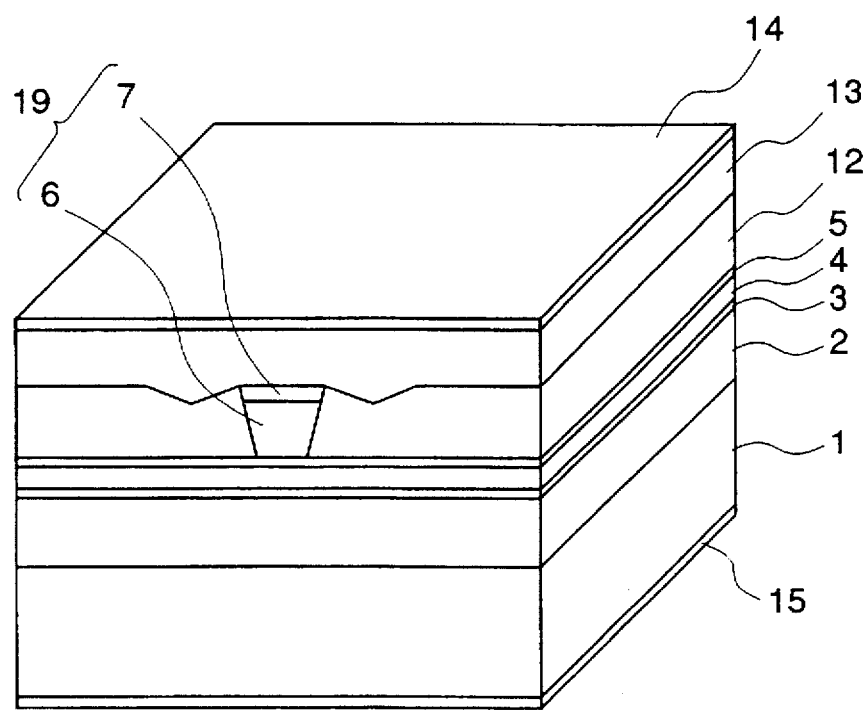
FIG. 1 is a perspective view illustrating a semiconductor laser in accordance with an embodiment of the present invention.

FIG. 1 is a perspective view illustrating a semiconductor laser in accordance with an embodiment of the present invention. In the figure, reference numeral 1 designates an n type GaAs semiconductor device having a (100) surface orientation. An n type $Al_xGa_{1-x}As$ (x=0.5) lower cladding layer 2 having a thickness of 1.5~2 μm is disposed on the (100) surface of the substrate 1. An active layer 3 having an effective band gap energy smaller than that of the lower cladding layer 2 is disposed on the lower cladding layer 2. The active layer 3 comprises a quantum well structure in which three 10 nm thick $Al_vGa_{1-v}As$ (v=0.05–0.15) well layers and two 10 nm thick $Al_wGa_{1-w}As$ (w=0.2–0.35) are alternatingly laminated and this laminated structure is put between two 35 nm thick optical guide layers comprising a material having the same composition as the barrier layers. These well layers, barrier layers, and optical guide layers are not shown in the figure. The active layer 3 may comprise materials other than AlGaAs, for example, InGaAs. A p type $Al_xGa_{1-x}As$ (x=0.5 ) first upper cladding layer 4 having a thickness of 0.2–0.5 μm is disposed on the active layer 3. A p type $Al_yGa_{1-y}As$ (y =0.7) etch stopping layer 5 having a thickness of about 200 Å is disposed on the first upper cladding layer 4. A p type $Al_xGa_{1-x}As$ (x=0.5) second upper cladding layer 6 having a thickness of 1.0–2.0 μm is disposed on a center part of the etch stopping layer 5. A p type GaAs first contact layer 7 having a thickness of 0.5~1 μm is disposed on the second upper cladding layer 6. The second upper cladding layer 6 and the first contact layer 7 form a stripe-shaped ridge structure 19 extending in the resonator length direction of the semiconductor laser, and the cross section of the ridge structure 9 in a plane perpendicular to the resonator length direction is a reverse mesa. An n type current blocking layer 12 comprising a material having an effective band gap energy smaller than that of the active layer is disposed on the etch stopping layer 5, contacting both sides of the ridge structure 19. In this embodiment of the invention, an n type GaAs current blocking layer is employed. A p type GaAs second contact layer 13 having a thickness of 2~3 μm is disposed on the first contact layer 7 and on the current blocking layer 12. A p side electrode 14 is disposed on the second contact layer 13 and an n side electrode 15 is disposed on the rear surface of the substrate 1.

A description is given of the operation. When a forward bias voltage is applied across the p side electrode 14 and the n side electrode 15 holes are injected into the quantum well active layer 3 through the p type GaAs second contact layer 13, the p type GaAs first contact layer 7, the p type second upper cladding layer 6, and the p type first upper cladding layer 4, and electrons are injected into the quantum well active layer 3 through the n type GaAs substrate 1 and the n type lower cladding layer 2. In the active layer 3, the electrons and holes recombine to generate induced light emission. When the quantity of the injected carriers is sufficient to produce light exceeding loss in the waveguide, laser oscillation occurs. In this embodiment of the invention, in the region adjacent to the ridge structure 19 and covered with the n type GaAs current blocking layer 12, pn junctions are produced between the n type current blocking layer 12 and the p type first upper cladding layer 4 and between the n type current blocking layer 12 and the p type second contact layer 13. Therefore, even when a voltage is applied with the p side electrode on the positive side, since pnp junctions are produced in regions other than the ridge structure 19 and the voltage is applied in the reverse direction in these regions, no current flows in these regions. Consequently, current flows only in the ridge structure 19 and is concentrated in the quantum well active layer 3 beneath the ridge structure 19, reaching a sufficient current density for laser oscillation. In addition, the n type GaAs current blocking layer 12 absorbs laser light produced in the quantum well active layer 3 because the band gap energy of GaAs is smaller than the effective band gap energy of the active layer 3. Thereby, the laser light is subjected to strong absorption at both sides of the ridge structure 19, so that the laser light is concentrated only in the vicinity of the ridge structure 19. As a result, horizontal transverse mode oscillation, which is an important operating characteristic of the semiconductor laser, having a single peak and high stability is produced.

FIGS. 2(a)–2(f) are cross-sectional views illustrating process steps in a method of fabricating the semiconductor laser shown in FIG. 1. In the figure, the same reference numerals as those shown in FIG. 1 designate the same or corresponding parts. Reference numeral 19 designates a stripe-shaped ridge structure having a perfect mesa cross section.

Figure 2:
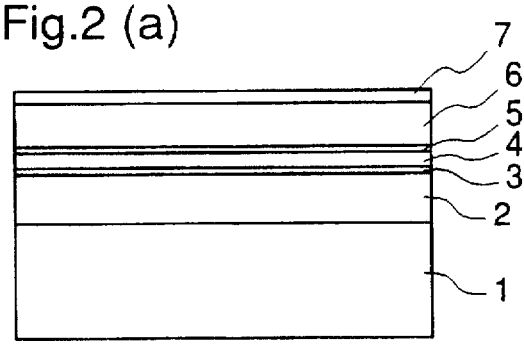
FIGS. 2(a)–2(f) are cross-sectional views illustrating process steps in a method of fabricating the semiconductor laser shown in FIG. 1.
Figure 2:
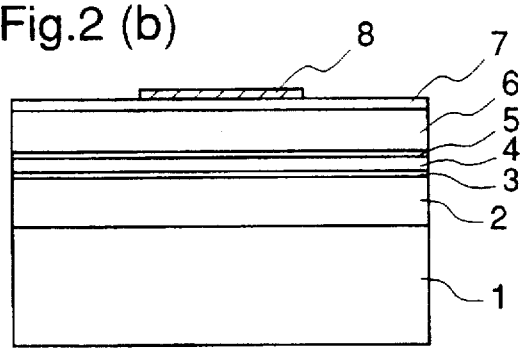
Figure 2:
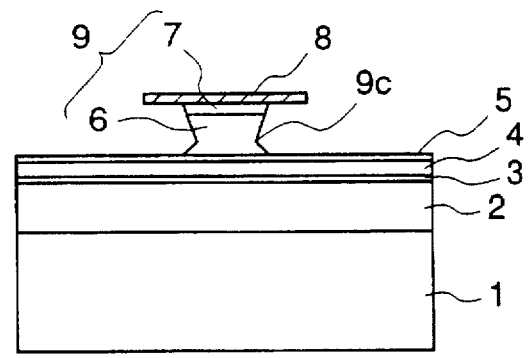
Figure 2:
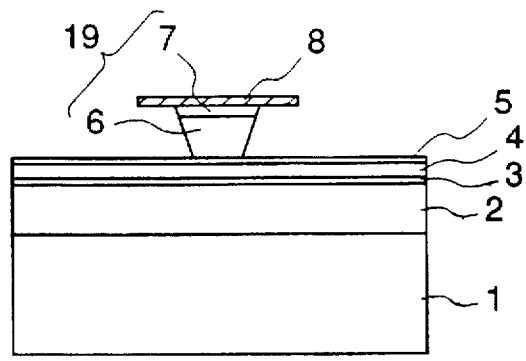
Figure 2:
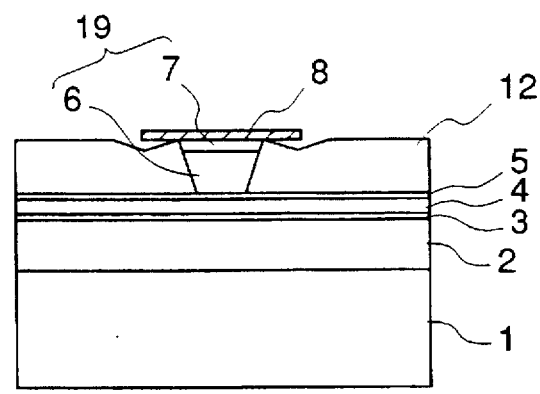
Figure 2:
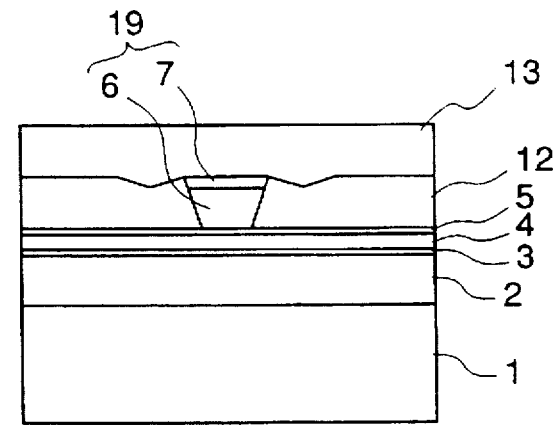

A description is given of the fabricating process. Initially, an n type GaAs semiconductor wafer 1 having a (100) surface orientation is prepared. On the (100) surface of the semiconductor wafer 1, the n type lower cladding layer 2, the active layer 3, the p type first upper cladding layer 4, the p type etch stopping layer 5, the p type second upper cladding layer 6, and the p type first contact layer 7 are epitaxially grown in this order. Preferably, these layers are grown by MOCVD (Metal Organic Chemical Vapor Deposition). FIG. 2(a) shows a cross-sectional view of the wafer after the epitaxial growth.

In the step of FIG. 2(b), an insulating film, such as $Si_3N_4$ or $SiO_2$, is deposited over the p type first contact layer 7 and patterned to form a stripe-shaped mask 8 extending in a reverse mesa direction, for example, the [011] direction. The width of the mask 8 in the resonator width direction is about 8 μm in this embodiment, but it is varied according to the specifications of the semiconductor laser. The stripe-shaped mask 8 serves as an etching mask when a ridge structure is formed, and the stripe direction of the mask 8 is the resonator length direction of the laser.

In the step of FIG. 2(c), using the mask 8, a first etching step is performed so that a reverse mesa ridge structure comprising the first contact layer 7 and the second upper cladding layer 6 is produced. In this first etching, a selective etchant that etches the p type GaAs first contact layer 7 and the p type $Al_xGa_{1-x}As$ (x=0.5) second upper cladding layer 6 but does not etch the p type $Al_yGa_{1-y}As$ (y=0.7) etch stopping layer 5 is employed, whereby the ridge structure 9 is produced with high reproducibility. For example, a mixture of tartaric acid and hydrogen peroxide is employed. This first etching step is carried out until the surface of the etch stopping layer 5 is exposed. The ridge structure 9 formed by this first etching is identical to the ridge structure of the prior art semiconductor laser shown in FIG. 3. That is, the ridge structure 9 has a constricted part 9c parallel to the stripe direction of the ridge at the lower part in the vicinity of the etch stopping layer 5. In this ridge structure, the ridge width is tapered from the top of the ridge to the constricted part 9c and then it is increased from the constricted part 9c to the bottom of the ridge contacting the etch stopping layer 5.

After the etching front reaches the etch stopping layer 5, the side walls of the ridge structure 9 are subjected to a second etching step using an etchant that etches the etch stopping layer 5 at a very low etching rate. This wet etching is generally called over-etching. By performing the over-etching for a prescribed time, the lower part of the ridge structure 9 with the width increasing toward the etch stopping layer 5 and the active layer 3 is etched selectively with respect to the etch stopping layer 5, whereby the angle produced between the side wall of the ridge and the surface of the etch stopping layer exposed by the over-etching is made an acute angle. As a result, a stripe-shaped ridge structure 19 having a perfect reverse mesa cross section in which the ridge width is tapered toward the active layer 3 is produced (FIG. 2(d)). When a mixture of tartaric acid (50% wt : hydrogen peroxide (31% wt) (=4:1) is employed as an etchant for the over-etching, the over-etching is carried out for 2.5 minutes to produce the ridge structure 19. The over-etching time is adjusted according to the width of the mask 8.

The reason why the ridge structure 19 with the perfect reverse mesa cross section (hereinafter referred to as a perfect reverse mesa structure) is produced by the over etching will be described. When the stripe direction of the mask 8 for forming the ridge structure is in the reverse mesa direction, the etching rate of a plane forming the side surface of the perfect reverse mesa structure is considerably lower than the etching rate of other planes, so that the side surface of the lower part of the ridge structure, which lower part does not form the reverse mesa structure, is selectively etched at a high etching rate. During the over-etching, since the etching in the direction perpendicular to the surface of the substrate 1 is stopped at the etch stopping layer 5, the over etching proceeds only in the horizontal direction parallel to the surface of the substrate 1, so that the over-etching can be carried out for sufficient time for producing the perfect reverse mesa structure.

The etchant used for the second etching step, i.e., the over-etching, may be used for the first etching step. In this case, since the switching from the first etching step to the second etching is dispensed with, the fabricating process is simplified.

After the formation of the ridge structure 19, the n type GaAs current blocking layer 12 is grown on the etch stopping layer 5, contacting both sides of the ridge structure 19 (FIG. 2(e)). Since the mask 8 serves as a mask for crystal growth, crystal growth does not occur on the ridge structure 19.

After removal of the mask 8 by wet or dry etching, the p type GaAs second contact layer 13 is grown on the first contact layer 7 and on the current blocking layer 12 (FIG. 2(f)). Thereafter, the n side electrode 15 is formed on the rear surface of the n type GaAs substrate 1, and the p side electrode 14 is formed on the p type GaAs second contact layer 13. Finally, resonator facets are produced by cleaving the wafer in the direction perpendicular to the stripe direction of the ridge structure 19, thereby completing the semiconductor laser shown in FIG. 1.

Figure 3:
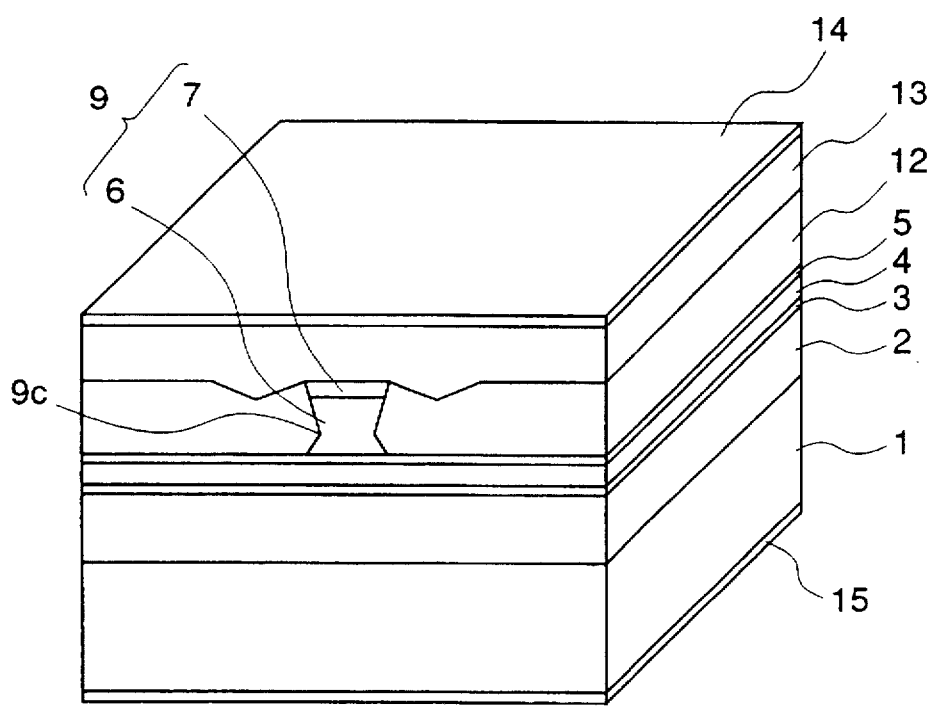
FIG. 3 is a perspective view illustrating a semiconductor laser according to the prior art.
Figure 4:
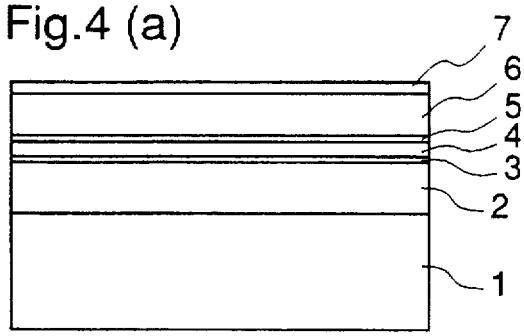
FIGS. 4(a)–4(e) are cross-sectional views illustrating process steps in a method of fabricating the semiconductor laser shown in FIG. 3.
Figure 4:
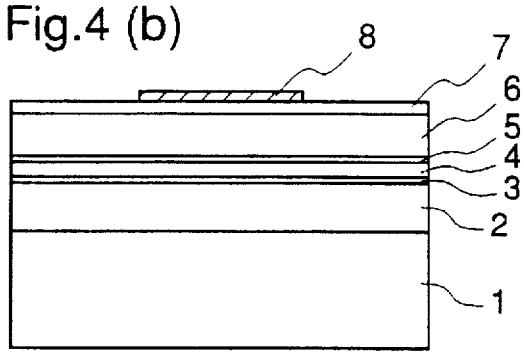
Figure 4:
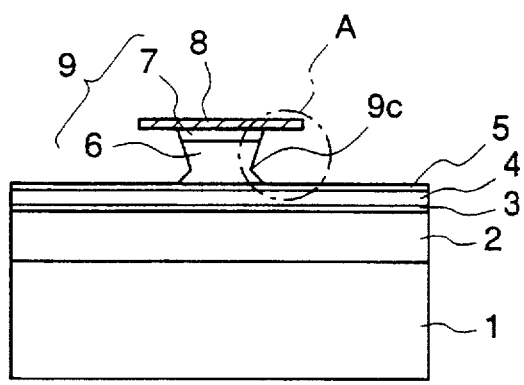
Figure 4:
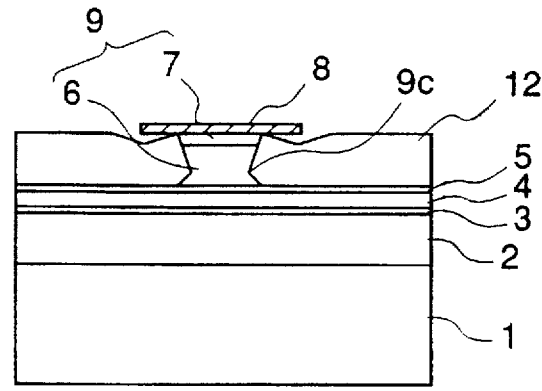
Figure 4:
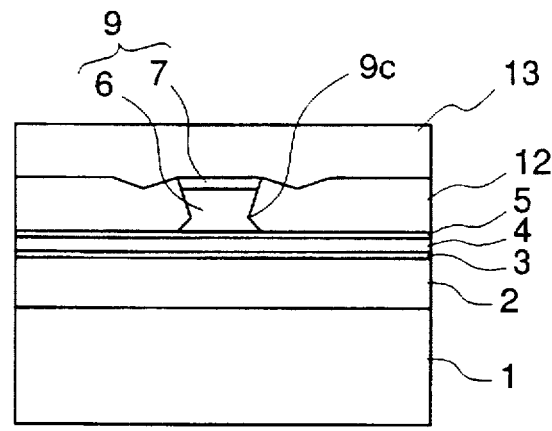
Figure 5:
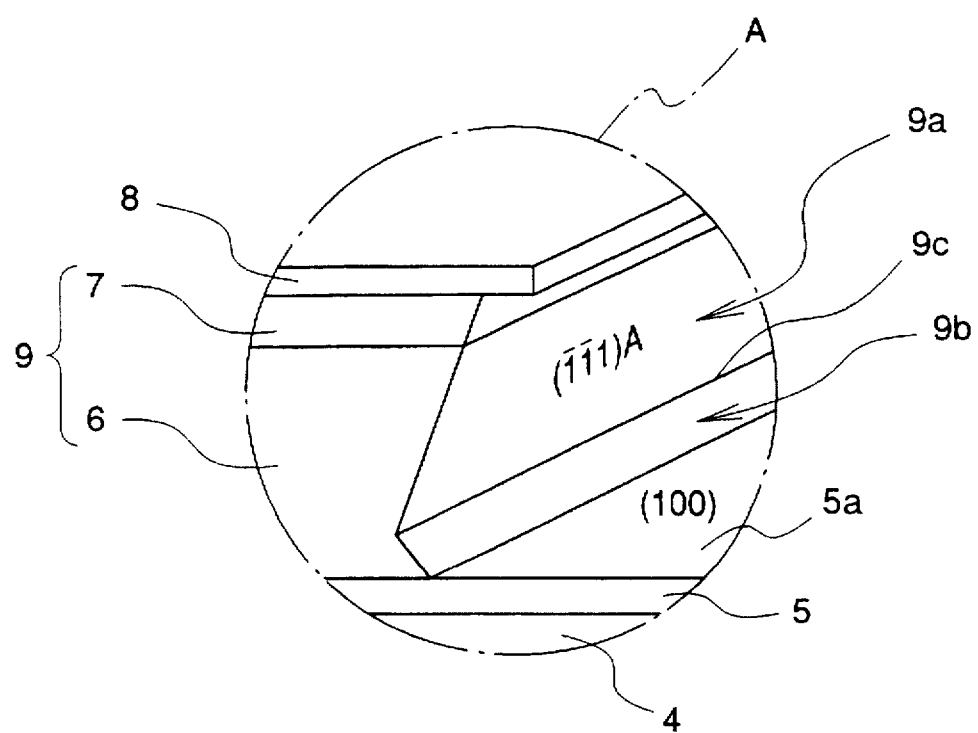
FIG. 5 is an enlarged perspective view of a part of the structure shown in FIG. 4(c).

In this semiconductor laser, since the ridge structure 19 has a perfect reverse mesa shape with the ridge width tapering toward the active layer 3, the ridge bottom width is narrowest in the ridge structure, in other words, other portions of the ridge structure are wider than the ridge bottom. So, unwanted increase in the resistance of the ridge structure 9 due to the constricted part 9c as the narrowest part in the ridge structure as in the prior art semiconductor laser shown in FIG. 3 is prevented. Therefore, the ridge bottom width can be reduced without increasing the resistance of the ridge structure 19, whereby a semiconductor laser including a reverse mesa ridge structure and having excellent high power output characteristics is easily obtained.

As described above, according to the present invention, the lower cladding layer 2, the active layer 3, the first upper cladding layer 4, the etch stopping layer 5, the second upper cladding layer 6, and the first contact layer 7 are successively grown on the substrate 1 and, thereafter, the stripe-shaped mask 8 is formed on the first contact layer 7. Using the stripe-shaped mask 8, the first contact layer 7 and the second upper cladding layer 6 are etched with an etchant that etches the etch stopping layer 5 at a very low etching rate until the surface of the etch stopping layer 5 is exposed, thereby producing the ridge structure 9. Further, the ridge structure 9 is etched with an etchant that etches the second upper cladding layer 6 at a relatively high etching rate and etches the etch stopping layer 5 at a relatively low etching rate, thereby producing the ridge structure 19. Therefore, a semiconductor laser having a reverse mesa ridge structure in which the ridge width is tapered toward the active layer 3 is obtained and a semiconductor laser having a reverse mesa ridge structure and excellent high-output characteristics is realized.

In the present invention, emphasis has been placed upon a semiconductor laser device including an n type substrate. However, a similar semiconductor laser device including a p type substrate is also within the scope of the present invention. Also in this case, the same effects as described above are obtained.

What is claimed is:

1. A method of fabricating a semiconductor laser comprising:

successively epitaxially growing on a surface of a first conductivity type crystalline semiconductor substrate, a first conductivity type lower cladding layer comprising a semiconductor material having an effective band gap energy, an active layer comprising a semiconductor material having an effective band gap energy smaller than the effective band gap energy of the lower cladding layer, a second conductivity type first upper cladding layer comprising the same semiconductor material as the lower cladding layer and having a first etching rate in an etchant, a second conductivity type etch stopping layer comprising a semiconductor material having a second etching rate, lower than the first etching rate, in the etchant, a second conductivity type second upper cladding layer comprising the same semiconductor material as the first upper cladding layer, and a second conductivity type first contact layer comprising a semiconductor material;

forming a stripe-shaped mask on the second conductivity type first contact layer, the mask extending in a direction relative to a crystalline orientation of the crystalline semiconductor substrate so that, upon etching of parts of the second conductivity type first contact layer and the second conductivity type second upper cladding layer not opposite the stripe-shaped mask with the etchant, a stripe-shaped ridge structure having a reverse mesa cross section and including parts of the second conductivity type first contact layer and the second conductivity type second upper cladding layer is formed on the etch stopping layer;

using the stripe-shaped mask, removing portions of the first contact layer and the second upper cladding layer not covered by the stripe-shaped mask in a first wet etching step using the etchant, thereby exposing the etch stopping layer and forming a mesa structure including parts of the second conductivity type first contact layer and the second conductivity type second upper cladding layer on the etch stopping layer;

removing portions of the second upper cladding layer in a second wet etching step to form a stripe-shaped ridge structure having a reverse mesa cross section;

growing a first conductivity type current blocking layer contacting both sides of the ridge structure;

removing the mask; and growing a second conductivity type second contact layer comprising the same semiconductor material as the first contact layer on the current blocking layer and on the first contact layer.

2. The method of fabricating a semiconductor laser as defined in claim 1 wherein the first conductivity type semiconductor substrate comprises GaAs, the first conductivity type lower cladding layer comprises $Al_xGa_{1-x}As$ ($0<x<1$), the second conductivity type first and second upper cladding layers comprise $Al_xGa_{1-x}As$ ($0<x<1$), the second conductivity type etch stopping layer comprises $Al_yGa_{1-y}As$ ($x<y<1$), the second conductivity type first and second contact layers comprise GaAs, and the second wet etching step employs a mixture of tartaric acid and hydrogen peroxide.

3. The method of fabricating a semiconductor laser as defined in claim 2 wherein the second wet etching step employs an etchant comprising tartaric acid having a concentration of 50 wt % and hydrogen peroxide having a concentration of 31% wt mixed in a ratio of 4:1 and is performed for 2.5 minutes.

4. The method of fabricating a semiconductor laser as defined in claim 3 including employing the same etchant in the first and second wet etching steps.

5. The method of fabricating a semiconductor laser as defined in claim 3 wherein the first conductivity type lower cladding layer comprises $Al_{0.5}Ga_{0.5}As$, the second conductivity type first and second upper cladding layers comprise $Al_{0.5}Ga_{0.5}As$, and the second conductivity type etch stopping layer comprises $Al_{0.7}Ga_{0.3}As$.

* * * * *